US005463337A

United States Patent [19]

Leonowich

[11] Patent Number: 5,463,337
[45] Date of Patent: Oct. 31, 1995

[54] DELAY LOCKED LOOP BASED CLOCK SYNTHESIZER USING A DYNAMICALLY ADJUSTABLE NUMBER OF DELAY ELEMENTS THEREIN

[75] Inventor: Robert H. Leonowich, Temple, Pa.

[73] Assignee: AT&T Corp., Murray Hill, N.J.

[21] Appl. No.: 160,107

[22] Filed: Nov. 30, 1993

[51] Int. Cl.⁶ .................................................. H03K 5/159
[52] U.S. Cl. ........................ 327/158; 327/261; 327/244; 327/113; 327/269
[58] Field of Search ....................... 328/154, 155, 328/63, 14; 307/262, 516, 603, 271; 331/17, 10; 327/158, 161, 244, 259, 261, 263, 264, 113, 114, 2, 231, 159, 269, 270

[56] References Cited

U.S. PATENT DOCUMENTS

| | | | |
|---|---|---|---|
| 5,049,766 | 9/1991 | van Driest et al. | 307/603 |
| 5,120,990 | 6/1992 | Koker | 328/155 |
| 5,260,608 | 11/1993 | Marbot | 307/271 |

OTHER PUBLICATIONS

Floyd M. Gardner, *Charge–Pump Phase–Lock Loops*, Nov., 1980, pp. 1849–1858.
Jeff Sonntag, Robert Leonowich, *Session 11: High–Speed Communication IC's; FAM 11.5: A Monolithic CMOS 10MHz DPLL for Burst–Mode Data Retiming*, 1900 IEE International Solid–State Circuits Conference (ISSCC 90) Feb. 16, 1990. pp. 194–195.

Primary Examiner—Timothy P. Callahan
Assistant Examiner—Dinh T. Le

[57] ABSTRACT

A delay-locked-loop based clock synthesizer for generating, from a reference signal, a clock signal having a frequency different from a frequency of the reference signal includes a delay-locked-loop circuit having a plurality of controllable delay elements serially connected to one another. Each of the delay elements delays the reference signal by an adjustable quantum of time such that the delay elements generate a plurality of delayed signals. A first multiplexer routes one of the delayed signals to a phase detector, which generates a control signal indicative of a difference between a phase of the routed delayed signal and a phase of the reference signal. A feedback loop transfers the control signal from the phase detector to the delay elements, wherein each of the delay elements adjusts, in accordance with the control signal, the quantum of time by which they each delay the reference signal, such that the phase of the reference signal is synchronized with the phase of the routed delayed signal. The clock synthesizer also includes one or more mixing circuits for logically combining the delayed signals such that the mixing circuits generate logically combined signals. A second multiplexer routes one of the received logically combined signals to an output of the second multiplexer, wherein the routed logically combined signal represents the clock signal.

6 Claims, 5 Drawing Sheets

DELAY LOCKED LOOP BASED CLOCK SYNTHESIZER USING A DYNAMICALLY ADJUSTABLE NUMBER OF DELAY ELEMENTS THEREIN

BACKGROUND OF THE INVENTION

1. Field of the Invention

The present invention relates generally to clock synthesizers for generating clock signals, and more particularly, to clock synthesizers which are implemented using delay locked loops having a dynamically adjustable number of delay elements located therein.

2. Related Art

A clock synthesizer generates a clock signal having a particular frequency from a reference clock, such as a crystal oscillator. As will be appreciated, it is often desirable to have the ability to generate, from a single reference clock, clock signals having frequencies which are different from the frequency of the reference clock. In other words, it is often desirable to have the ability to synthesize multiple clock frequencies from a single reference clock frequency.

FIG. 1 is a block diagram of a conventional circuit 102 which performs this function. The circuit 102 of FIG. 1 includes a phase locked loop 114 having a phase detector 106, a loop filter 108, and a voltage controlled oscillator (VCO) 110.

Phase locked loops are well known and, thus, the structure and operation of the phase locked loop 114 contained in the circuit 102 of FIG. 1 will be apparent to persons skilled in the relevant art. It is noted that phase locked loops are discussed in many publicly available documents, such as *Phase Locked Loops* by R.E. Best (McGraw Hill, New York, 1984).

It should also be noted that phase detectors and loop filters can be classified as voltage-based or charge-pump based. For brevity, only a charge-pump based system will be discussed here, but the following discussion is also applicable to voltage-based systems.

The circuit 102 of FIG. 1 also includes a "divide by N" divider 104 (hereafter called the "N divider") and a "divide by M" divider 112 (hereafter called the "M divider"). The N divider 104 operates to generate an output signal from an input signal, wherein the frequency of the output signal is equal to the frequency of the input signal divided by N. Similarly, the M divider 112 operates to generate an output signal from an input signal, wherein the frequency of the output signal is equal to the frequency of the input signal divided by M.

The dividers 104 and 112 can be implemented using a trigger (or T) flip flop (see FIG. 2), whose output signal $S_{OUT}$ changes state with each rising edge of its input signal $S_{IN}$ (see FIG. 3). As is apparent from the waveforms in FIG. 3, a divide by two divider (that is, where N and/or M equals 2) can be implemented using a single T flip flop. The manner in which T flip flops can be combined and used to implement dividers for other values of N and M will be apparent to persons skilled in the relevant art.

Referring again to FIG. 1, the N divider 104 and the M divider 112 operate to modify an input signal $F_{IN}$ (which is generated from a reference clock, not shown) and an output signal $F_{OUT}$ in the manner described above. These modified signals are transferred to the phase detector 106 and, consequently, these modified signals are processed by the phase locked loop 114 in a well known manner. The steady state frequency of the output signal $F_{OUT}$ can be described by the following relationship:

$$\text{frequency}(F_{OUT}) = (M/N) * \text{frequency}(F_{IN})$$

Typically, $F_{IN}$ is a signal having a fixed frequency, and the N divider 104 and the M divider 112 are implemented such that the values of N and M can be dynamically adjusted. Thus, the frequency of $F_{OUT}$ can be set to a particular frequency value by appropriately setting the values of N and M. Table 1 illustrates the frequencies which can be synthesized for particular values of N and M. For example, where N is 1 and M is 3, an output signal $F_{OUT}$ can be generated from an input signal $F_{IN}$, wherein the frequency of $F_{OUT}$ is three times the frequency of $F_{IN}$.

TABLE 1

| Available Frequency Synthesizer Frequencies | | |
|---|---|---|
| N | M | frequency ($F_{OUT}$)/ frequency ($F_{IN}$) |
| 1 | 3 | 3 |
| 2 | 3 | 1.5 |
| 3 | 3 | 1 |
| 1 | 4 | 4 |
| 2 | 4 | 2 |
| 3 | 4 | 1.333 |
| 1 | 5 | 5 |
| 2 | 5 | 2.5 |
| 3 | 5 | 1.667 |

As is well known, phase locked loop circuits are plagued by many problems. These problems include jitter peaking, stability, acquisition behavior, and process variability. These and other problems of phase locked loop circuits are discussed in many publicly available documents, such as *Phase Locked Loops*, cited above.

As is clear from the discussion above, the conventional circuit 102 of FIG. 1 enables one to generate, from a single reference clock, clock signals having frequencies which are different from the frequency of the reference clock. However, since it utilizes a phase locked loop 114, the conventional circuit 102 suffers from the same problems that plague phase locked loop circuits.

Thus, what is required is a clock synthesizer which enables one to generate, from a single reference clock, clock signals having frequencies which are different from the frequency of the reference clock, and which does not suffer from the problems that plague phase locked loop based clock synthesizers.

SUMMARY OF THE INVENTION

The present invention is directed to a delay-locked-loop based clock synthesizer for generating, from a reference signal, a clock signal having a frequency different from a frequency of the reference signal. The clock synthesizer of the present invention includes a delay-locked-loop circuit.

The delay-locked-loop circuit includes a plurality of controllable delay elements serially connected to one another. Each of the delay elements delays the reference signal by an adjustable quantum of time such that the delay elements generate a plurality of delayed signals offset in time from one another and from the reference signal.

A first multiplexer, which is coupled to one or more of the delay elements, receives the delayed signals generated by the one or more of the delay elements, and routes one of the received delayed signals to an output of the first multiplexer.

A phase detector, which is connected to the output of the first multiplexer, receives the routed delayed signal and the reference signal, and generates a control signal indicative of a difference between a phase of the routed delayed signal and a phase of the reference signal.

The delay-locked-loop circuit also includes a feedback loop, connected to the delay elements and the phase detector, for transferring the control signal from the phase detector to the delay elements. Each of the delay elements adjusts, in accordance with the control signal, the quantum of time by which they each delay the reference signal, such that the phase of the reference signal is synchronized with the phase of the routed delayed signal.

The clock synthesizer also includes one or more mixing circuits, wherein each of the mixing circuits is connected to the controllable delay circuit and is associated with one of the one or more delay elements. The mixing circuits include combinational networks for logically combining the delayed signals such that the mixing circuits generate logically combined signals.

The clock synthesizer further includes a second multiplexer, connected to the mixing circuits, for receiving the logically combined signals and for routing one of the received logically combined signals to an output of the second multiplexer, wherein the routed logically combined signal represents the clock signal.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE FIGURES

The present invention will be described with reference to the accompanying drawings, wherein.

DETAILED DESCRIPTION OF THE PREFERRED EMBODIMENTS

The present invention is directed to a clock synthesizer for synthesizing frequencies which are different from a reference clock frequency. In other words, the present invention is directed to a clock synthesizer for generating, from a single reference clock, clock signals having frequencies which are different from each other, and different from the frequency of the reference clock. The clock synthesizer of the present invention does not suffer from the problems that plague phase locked loop based clock synthesizers.

Figure 4:
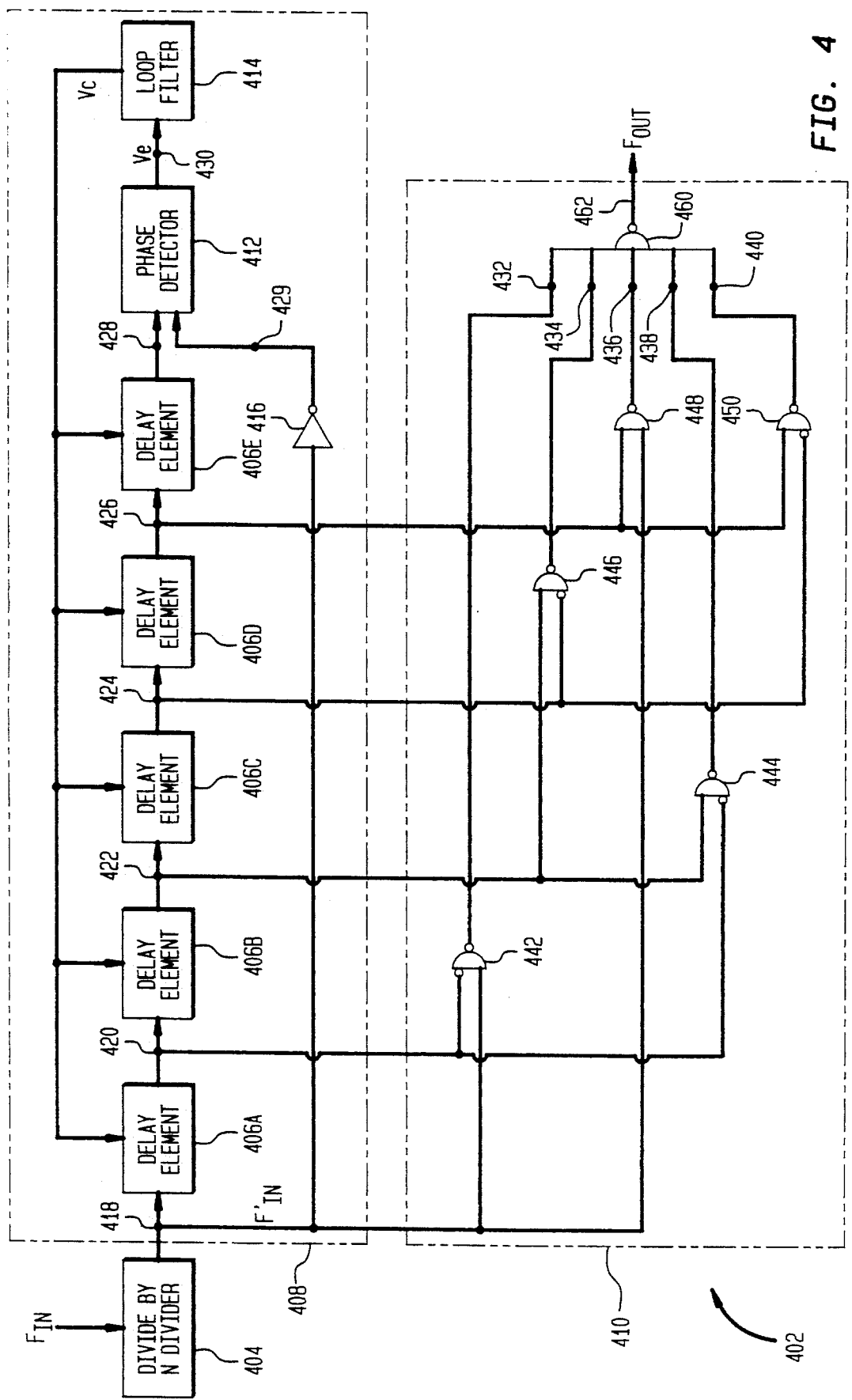
FIG. 4 is a block diagram of a delay locked loop-based clock synthesizer according to a preferred embodiment of the present invention.

FIG. 4 is a block diagram of a clock synthesizer 402 according to a preferred embodiment of the present invention. A reference clock (not shown), which is preferably a crystal oscillator, generates an input signal $F_{IN}$ (also called herein a reference clock signal), wherein the input signal $F_{IN}$ has a predetermined frequency. As will be appreciated, clock frequency requirements vary among applications. Thus, the value of the predetermined frequency of the input signal $F_{IN}$ is implementation dependent.

The clock synthesizer 402 operates generally as follows. The clock synthesizer 402 generates an output signal $F_{OUT}$ from the input signal $F_{IN}$, wherein the frequency of the output signal $F_{OUT}$ is usually different from the predetermined frequency of the input signal $F_{IN}$. More particularly, the frequency of the output signal $F_{OUT}$ is an integer or non-integer multiple (or fraction) of the predetermined frequency of the input signal $F_{IN}$.

This integer or non-integer multiple (or fraction) by which the frequency of the output signal $F_{OUT}$ varies from the predetermined frequency of the input signal $F_{IN}$ may be dynamically adjusted, such that the frequency of the output signal $F_{OUT}$ may be dynamically adjusted. In this manner, the clock synthesizer 402 of the present invention synthesizes frequencies which differ from each other, and which differ from the frequency of the reference clock signal. The clock synthesizer 402 shall now be described in detail.

Figure 1:
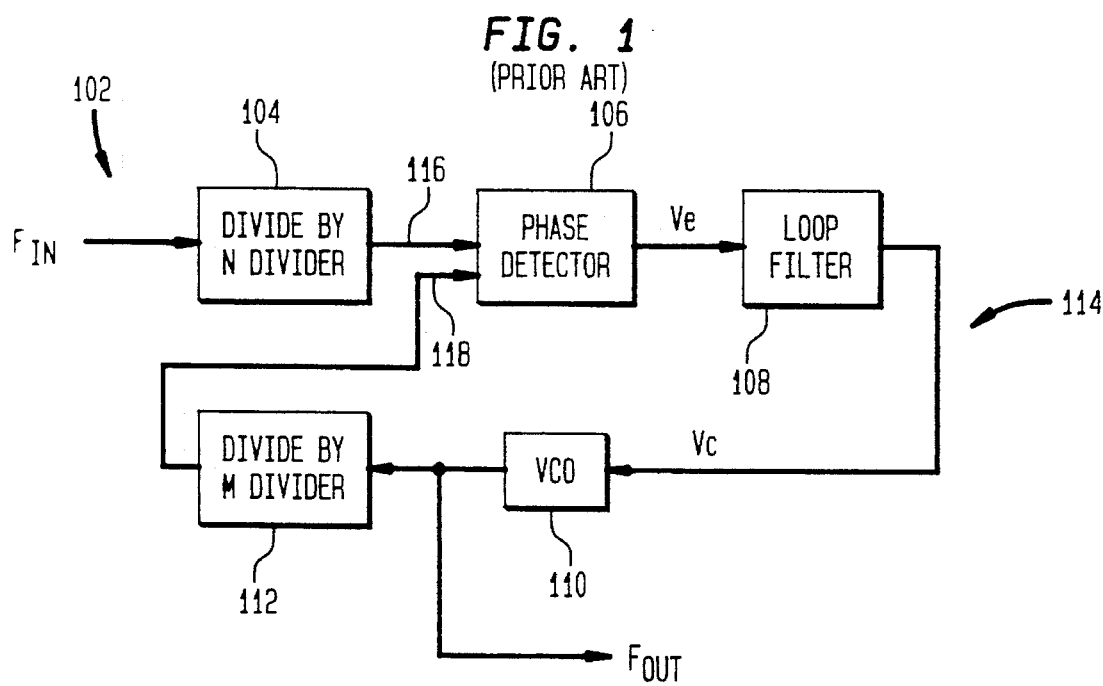
FIG. 1 is a block diagram of a conventional phase locked loop-based clock synthesizer.
Figure 2:
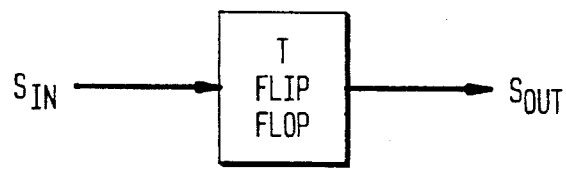
FIG. 2 is a block diagram of a conventional divider which is implemented using a trigger flip flop.
Figure 3:
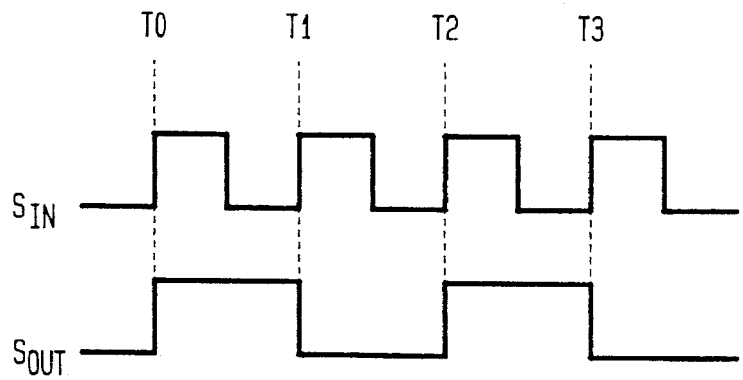
FIG. 3 shows signals used to illustrate the operation of the divider of FIG. 2.

The clock synthesizer 402 includes a "Divide by N" divider 404 (hereafter call the "N divider") which receives the input signal $F_{IN}$. The N divider 404 is similar in structure and operation to the N divider 104 and the M divider 112 shown in FIG. 1, and discussed above. The N divider 404 operates to generate a modified input signal $F_{IN}'$ from the input signal $F_{IN}$, wherein the frequency of the modified input signal $F_{IN}'$ is equal to the frequency of the input signal $F_{IN}$ divided by N. As discussed further below, the N divider 404 enables the clock synthesizer 402 to synthesize a broader range of frequencies.

The modified input signal $F_{IN}'$ is transferred to a delay locked loop 408. Delay locked loops are generally well known, and are discussed in many publicly available documents, such as "A Monolithic CMOS 10 MHz DPLL For Burst-Mode Data" by Sonntag and Leonowich (ISSCC Digest, 1990), which is herein incorporated by reference in its entirety.

The delay locked loop 408 is similar in structure to a phase locked loop, and operates in the same way as a phase locked loop. In the delay locked loop 408, however, a controllable delay line comprising a plurality of controllable delay elements 406 has replaced the voltage controlled oscillator (VCO) of the phase locked loop.

As will be appreciated, the problems (such as jitter peaking, stability, acquisition behavior, and process variability) which plague phase locked loop are due to the VCO contained therein. Since the delay locked loop 408 does not include a VCO, the delay locked loop 408 does not suffer from the problems which plague phase locked loops. Consequently, since the clock synthesizer 402 of the present invention is based on a delay locked loop, rather than a phase locked loop, the clock synthesizer 402 of the present invention does not suffer from the problems which plague phase locked loop-based clock synthesizers.

The operation of the delay locked loop 408 shall now be described.

Figure 5:
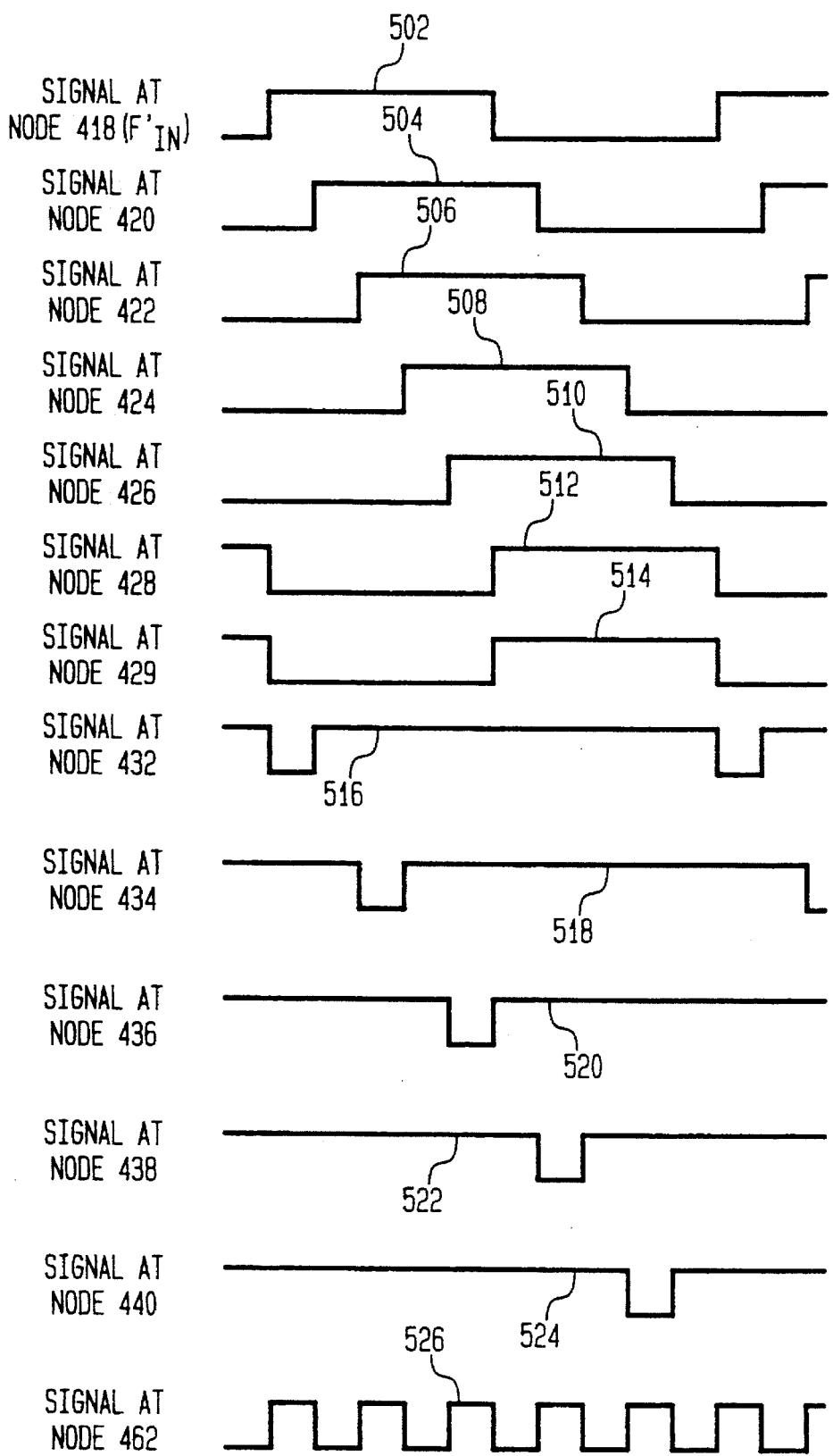
FIG. 5 shows signals used to illustrate the operation of the clock synthesizer of FIG. 4.

The modified input signal $F_{IN}'$ is received by a delay element 406A. The delay element 406A delays the modified input signal $F_{IN}'$ by a quantran of time to produce a signal at a node 420, which differs in phase from the modified input signal $F_{IN}'$ by the quantum of time. This is shown in FIG. 5, wherein a signal 502 represents the signal present at a node 418 (that is, the modified input signal $F_{IN}'$) and a signal 504 represents the signal at the node 420 generated by the delay element 406A.

The operation of the other delay elements 406B, 406C, 406D, and 406E is the same as the operation of the delay element 406A. Each delay element 406 delays an input signal which it receives by a quantum of time to generate an output signal which differs in phase from its input signal by the quantum of time. This is shown in FIG. 5, wherein a signal 506 represents the signal present at a node 422 generated by the delay element 406B, a signal 508 represents the signal present at a node 424 generated by the delay element 406C, a signal 510 represents the signal present at a node 426 generated by the delay element 406D, and a signal 512 represents the signal present at a node 428 generated by the delay element 406E.

The quantum of time introduced by each of the delay elements 406 is the same. The delay elements 406 are controllable, such that the amount of delay introduced by each is adjustable.

The delay elements 406 can be implemented in any number of ways. For example, the delay elements 406 can be implemented using a combination of multiplexers, inverters, and/or registers. Persons skilled in the relevant art will find it apparent to implement controllable delay elements, particularly in light of the publicly available documents which discuss controllable delay elements, such as "A Monolithic CMOS 10 MHz DPLL For Burst-Mode Data," cited above.

An inverter 416 inverts the modified input signal $F_{IN}'$. This inverted modified input signal, which is present at a node 429, is shown in FIG. 5 as a signal 514.

A phase detector 412 receives the signal generated by the delay element 406E and present at the node 428 (that is, the signal 512 in FIG. 5). The phase detector 412 also receives the inverted modified input signal which is present at the node 429 (that is, the signal 514 in FIG. 5).

The structure and operation of phase detectors are well known. The phase detector 412 compares the phase of the signal 512 to the phase of the signal 514 (preferably, the phase detector 412 operates to match a rising edge of the signal 512 to a rising edge of the signal 514), and generates an error voltage Ve (or, alternatively, an error current), wherein the magnitude of the error voltage Ve is proportional to the difference in phase between these two signals 512 and 514.

The error voltage Ve is processed in a well known manner by a loop filter 414 to produce a control voltage Vc. The loop filter 914 is a low-pass filter which integrates the error voltage (or current) to a relatively constant control voltage Vc. Preferably, because of the low pass nature of the loop filter 414, the control voltage Vc is approximately the average value of the error voltage, Ve. The magnitude of the control voltage Vc is proportional to the delay through the delay elements 406A-E.

The control voltage Vc is transferred to each of the delay elements 406, and causes the delay elements 406 to modify the amount of delay which they each introduce. When the signal 512 present at the node 428 is equal in phase to the signal 514 present at the node 429, the error voltage Ve and the control voltage Vc will correspond to a value which causes delay elements 406 to have a collective propagation delay equal to $\frac{1}{2}F_{IN}'$.

When the signal 512 present at the node 428 is not equal in phase to the signal 514 present at the node 429, the error voltage Ve has a non-zero magnitude which is proportional to this phase difference. The loop filter 414 integrates this error voltage Ve (or error current) and modifies Vc appropriately. Upon receiving the control voltage Vc, the delay elements 406 modify the amount of delay which they introduce in accordance with the nonzero magnitude of the error voltage Ve. In this manner, the phase detector 412 controls the amount of delay which the delay elements 406 introduce such that the phase of the signal 512 present at the node 428 is equal to the phase of the signal 514 present at the node 429.

The signals shown in FIG. 5 are those which are generated after the delay locked loop 408 has reached a "steady state." That is, the signals in FIG. 5 are those which are generated after the phase detector 412 has adjusted the amount of delay introduced by the delay elements 406 such that the phase of the signal 512 is equal to the phase of the signal 5 14.

As apparent from FIG. 5, the phase detector 412 preferably operates to match the phase of the signal 512 to the phase of the signal 514 after the passage of one half a period of the modified input signal $F_{IN}'$. Consequently, the amount of time delay introduced by each of the delay elements 406 when the delay locked loop is in the "steady state" condition is represented by the following equation: $1/(2*\text{frequency}(F_{IN}')*X)$, where X is the number of delay elements 406 in the delay locked loop 408 (in the embodiment of FIG. 4, X is equal to five).

Alternatively, the phase detector 412 could be implemented such that it matches the phase of the signal 512 present at the node 428 to the phase of the signal 514 present at the node 429 after other predetermined time periods, such as after the passage of one full period of the modified input signal $F_{IN}'$. In this case, the amount of time delay introduced by each of the delay elements 406 when the delay locked loop is in the "steady state" condition is represented by the following equation: $1/(\text{frequency}(F_{IN}')*X)$.

The signals 502–512 have the same frequency but different phases. Thus, the delay locked loop 408, by itself, cannot synthesize clock frequencies which are different from the frequency of the reference clock signal $F_{IN}$. Conventionally, delay locked loops are used for purposes other than frequency synthesis, such as pulse shaping a transmitted wave (this operation is sometimes called "pre-distortion"). Conventional uses of delay locked loops are described in "A Monolithic CMOS 10 MHz DPLL For Burst-Mode Data," cited above.

According to the present invention, a mixing circuit 410 is used to generate, from the signals 502–512 generated by the delay locked loop 408, a clock signal 526 having a frequency which is different from the frequency of the reference clock signal $F_{IN}$ and which is different from the frequency of the modified reference clock signal $F_{IN}'$ (signal 502). The mixing circuit 410 shall now be described.

The mixing circuit 410 includes NAND gates 442, 444, 446, 448, 450, and 460 (the bubbles at some of the inputs of these NAND gates represent inversion). These NAND gates 442, 444, 446, 448, 450, 460 are interconnected and receive the signals 502–512 generated by the delay locked loop 408 such that the mixing circuit 410 generates a clock signal 526 having a frequency which is different from the frequencies of the reference clock signal $F_{IN}$ and the modified reference clock signal $F_{IN}'$.

Specifically, the signal 502 present at the node 418 is applied to the NAND gate 442. Also, the signal 504 at the node 420 is inverted and applied to the NAND gate 442. The NAND gate 442 performs the well known "NAND" logical operation using these two signals to thereby produce a signal 16 (FIG. 5), which is present at a node 432, and which is applied to the NAND gate 460.

In a similar manner, the NAND gate 444 produces a signal 522, which is present at a node 438, and which is applied to the NAND gate 460. The NAND gate 446 produces a signal 518, which is present at a node 434, and which is applied to the NAND gate 460. The NAND gate 448 produces a signal 520, which is present at a node 436, and which is applied to the NAND gate 460. The NAND gate 450 produces a signal 524, which is present at a node 440, and which is applied to the NAND gate 460.

The NAND gate 460 performs the well known "NAND" operation using these signals 432, 434, 436, 438, 440 discussed above to thereby produce a signal 526, which is present at a node 462, and which represents the output signal $F_{OUT}$. As is apparent from FIG. 5, the frequency of the output signal $F_{OUT}$ is five times the frequency of the modified input signal $F_{IN}'$.

It should be understood that the mixing circuit 402 could be alternatively implemented using a combinational network different from that shown in FIG. 4. The structure and operation of such alternative combinational networks will be apparent to persons skilled in the relevant art.

The N divider 404 enables the clock synthesizer 402 to synthesize a broader range of frequencies. This is the case, since the N divider 404 generates a modified input signal $F_{IN}'$ from the input signal $F_{IN}$, wherein the frequency of the modified input signal $F_{IN}'$ is equal to the frequency of the input signal $F_{IN}$ divided by N. Table 2 illustrates the frequencies which can be synthesized for particular values of N using the clock synthesizer 402 shown in FIG. 4. For example, where N is 1, the frequency of $F_{OUT}$ is five times the frequency of $F_{IN}$ (this is the case shown in FIG. 5).

TABLE 2

| | Available Synthesizer Frequencies |
|---|---|
| N | frequency ($F_{OUT}$)/ frequency ($F_{IN}$) |
| 1 | 5 |
| 2 | 2.5 |
| 3 | 1.667 |

As apparent from an inspection of both Tables 1 and 2, the clock synthesizer 402 of FIG. 4 is limited relative to the phase locked loop synthesizer 102 (shown in FIG. 1) in the number of frequencies which it can synthesize from the reference clock frequency (that is, from the frequency of the input signal $F_{IN}$). In particular, the clock synthesizer 402 of FIG. 4 cannot synthesize the frequencies corresponding to M equals 3 and M equals 4 shown in Table 1. This is the case, since there are no phase transitions at the appropriate times in a five tap delay locked loop (that is, a delay locked loop having five delay elements). However, these frequencies can be synthesized using three and four tap delay locked loops (in combination with mixing circuits), since such delay locked loops produce signals having phase transitions which occur at the appropriate times. This is described in detail below.

Figure 6:
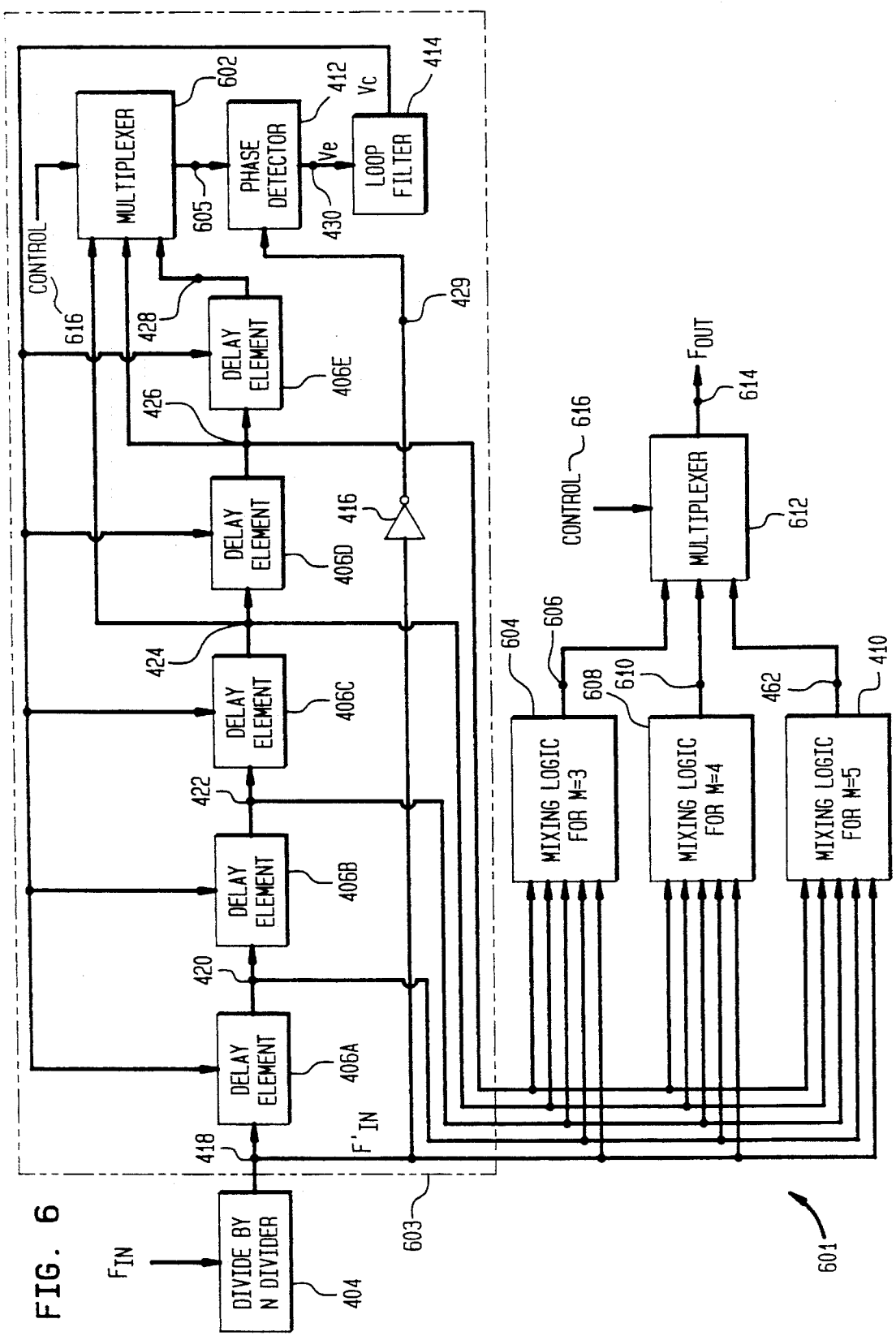
FIG. 6 is a block diagram of a delay locked loop-based clock synthesizer according to an alternate embodiment of the present invention.

FIG. 6 is a block diagram of a clock synthesizer 601 according to an alternate embodiment of the present invention. A reference clock (not shown), which is preferably a crystal oscillator, generates an input signal, or reference clock signal, $F_{IN}$.

The clock synthesizer 601 includes a "Divide by N" divider 404 (hereafter call the "N divider") which is identical in structure and operation to the N divider 404 shown in FIG. 4. The N divider operates to generate a modified input signal $F_{IN}'$ from the input signal $F_{IN}$, wherein the frequency of the modified input signal $F_{IN}'$ is equal to the frequency of the input signal $F_{IN}$ divided by N.

The modified input signal $F_{IN}'$ is transferred to a delay locked loop 603. The delay locked loop 603 shown in FIG. 6 is similar in operation and structure to the delay locked loop 408 shown in FIG. 4. The differences between these two delay locked loops 408, 603 shall now be discussed.

In addition to the delay elements 406, the phase detector 412, and the loop filter 414, the delay locked loop 603 shown in FIG. 6 includes a multiplexer 602 which is positioned between the delay elements 406C, 406D, 406E and the phase detector 412. The multiplexer 602 routes to the phase detector 412 either the signal output by the delay element 406C (and present at the node 424), the signal output by the delay element 406D (and present at the node 426), or the signal output by the delay element 406E (and present at the node 428).

The phase detector 412 also receives the inverted modified input signal. Thus, when the multiplexer 602 routes to the phase detector 412 the signal output by the delay element 406E (and present at the node 428), the phase detector 412 operates to check whether the phase of the signal present at the node 428 is substantially equal to the phase of the signal present at the node 429 (for reference purposes, this is called the five tap case). Note that all five of the delay elements 406 are used to ultimately produce the signal present at the node 428, wherein each of the delay elements 406 introduces a time delay of $1/(2*\text{frequency}(F_{IN}')*5)$. In the five tap case, the signals produced by the delay elements 406 are shown as 504, 506, 508, 510, and 512 in FIG. 5.

Figure 8:
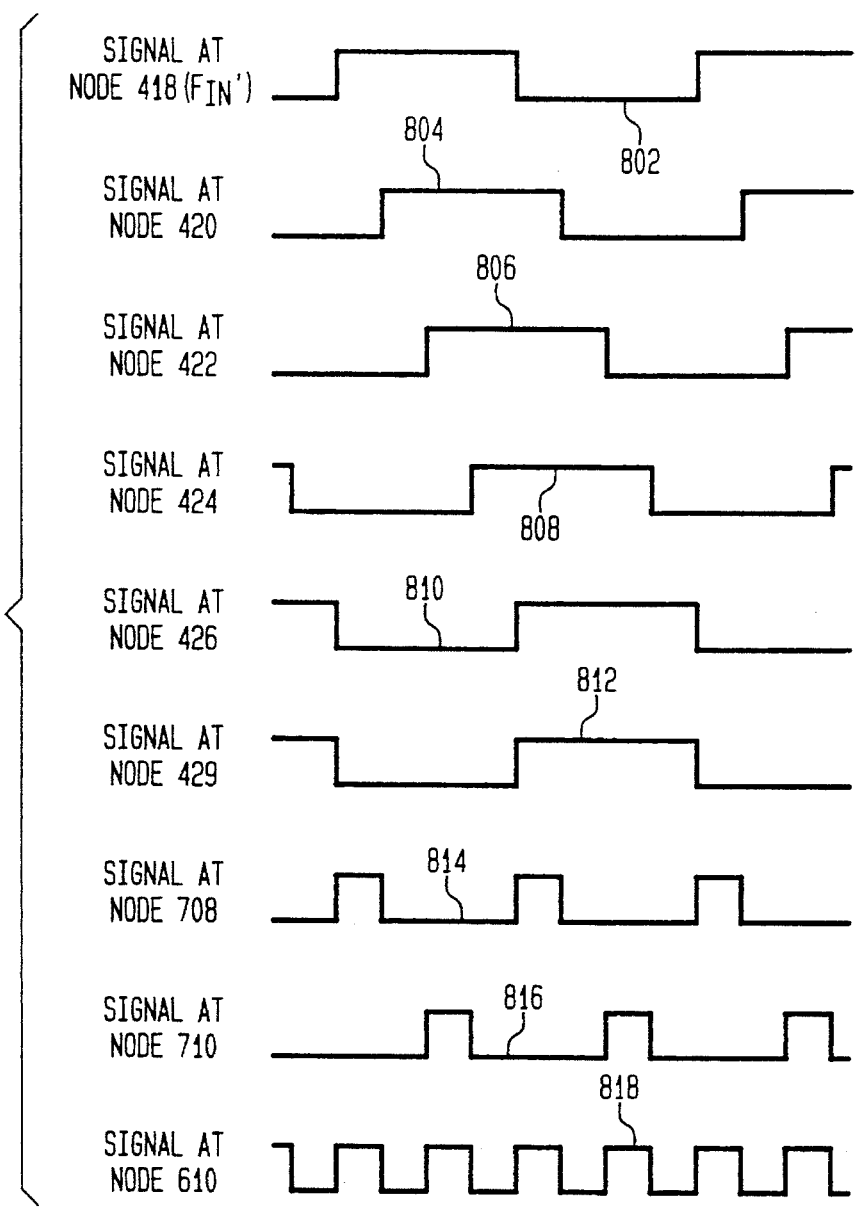
FIG. 8 shows signals used to illustrate the operation of the clock synthesizer of FIG. 6.

When the multiplexer 602 routes to the phase detector 412 the signal output by the delay element 406D (and present at the node 426), the phase detector 412 operates to check whether the phase of the signal present at the node 426 is substantially equal to the phase of the signal present at the node 429 (for reference purposes, this is called the four tap case). Note that only four of the delay elements 406A–406D are used to ultimately produce the signal present at the node 426, wherein each of these four delay elements 406A–406D introduces a time delay of $1/(2*\text{frequency}(F_{IN}')*4)$. In the four tap case, the signals produced by the delay elements 406A–406D are shown as 804, 806, 808, and 810 in FIG. 8.

When the multiplexer 602 routes to the phase detector 412 the signal output by the delay element 406C (and present at the node 424), the phase detector 412 operates to check whether the phase of the signal present at the node 424 is substantially equal to the phase of the signal present at the node 429 (for reference purposes, this is called the three tap case). Note that only three of the delay elements 406A–406C are used to ultimately produce the signal present at the node 424, wherein each of these three delay elements 406A–406C introduces a time delay of $1/(2*\text{frequency}(F_{IN}')*3)$. The shape of the signals produced by the delay elements 406A–406C in the three tap case will be apparent to persons skilled in the relevant art based on the teachings contained herein.

Note that, since the time delay introduced by the delay elements 406 during the four tap case is different than during the five tap case (assuming the same frequency($F_{IN}$') in both cases), the phase of the signals produced in the four tap case is different than the phase of the signals produced in the five tap case. Consequently, frequencies which cannot be synthesized in the five tap case can be synthesized in the four tap case.

Similarly, since the time delay introduced by the delay elements 406 during the three tap case is different than during the four and five tap cases (assuming the same frequency($F_{IN}$') in both cases), the phase of the signals produced in the three tap case is different than the phases of the signals produced in the four and five tap case. Consequently, frequencies which cannot be synthesized in the four and five tap cases can be synthesized in the three tap case.

The clock synthesizer 601 includes three mixing circuits 604, 608, and 410. Each of the mixing circuits 604, 608, and 410 is used to generate, from the signals generated by the delay locked loop 603, a clock signal having a frequency which is different from the frequency of the reference clock signal $F_{IN}$, and which is different from the frequency of the modified reference clock signal $F_{IN}$'.

Specifically, during the five tap case, the mixing circuit 410 generates a clock signal having a frequency which is different from the frequencies of the reference clock signal $F_{IN}$ and the modified reference clock signal $F_{IN}$'. During the five tap case, the signals generated by the mixing circuits 604 and 610 are ignored (as described below).

Similarly, during the four tap case, the mixing circuit 608 generates a clock signal having a frequency which is different from the frequencies of the reference clock signal $F_{IN}$ and the modified reference clock signal $F_{IN}$'. During the four tap case, the signals generated by the mixing circuits 604 and 410 are ignored. Also, during the three tap case, the mixing circuit 604 generates a clock signal having a frequency which is different from the frequencies of the reference clock signal $F_{IN}$ and the modified reference clock signal $F_{IN}$'. During the three tap case, the signals generated by the mixing circuits 608 and 410 are ignored.

A multiplexer 612 receives the signals generated by the mixing circuits 604, 608, 410. The multiplexer 612 routes one of these signals to a node 614. This signal present at node 614 is the output signal $F_{OUT}$. The routing functions performed by the multiplexers 602 and 612 are controlled by a single control signal 616. The control signal 616 is generated by a control mechanism (not shown), which determines whether the clock synthesizer 601 operates in the three tap case, the four tap case, or the five tap case. The control mechanism, which may operate according to input from a user, preferably adjusts to the clock frequency needs of the system in which it is contained and, therefore, the control mechanism is implementation dependent.

Preferably, when the control mechanism determines that the clock synthesizer 601 should operate in the three tap case, the control mechanism generates the control signal 616 such that the multiplexer 602 routes the signal present at node 424 to the phase detector 412, and such that the multiplexer 612 routes the signal generated by the mixing circuit 604 to the node 614.

When the control mechanism determines that the clock synthesizer 601 should operate in the four tap case, the control mechanism generates the control signal 616 such that the multiplexer 602 routes the signal present at node 426 to the phase detector 412, and such that the multiplexer 612 routes the signal generated by the mixing circuit 608 to the node 614.

When the control mechanism determines that the clock synthesizer 601 should operate in the five tap case, the control mechanism generates the control signal 616 such that the multiplexer 602 routes the signal present at node 428 to the phase detector 412, and such that the multiplexer 612 routes the signal generated by the mixing circuit 410 to the node 614.

The mixing circuits 604, 608, and 410 shall now be described.

The mixing circuit 410 can be implemented using various combinational networks. The structure and operation of such combinational networks will be apparent to persons skilled in the relevant art. One combinational network which can be used to implement the mixing circuit 410 is shown in FIG. 4 (described above).

Figure 7:
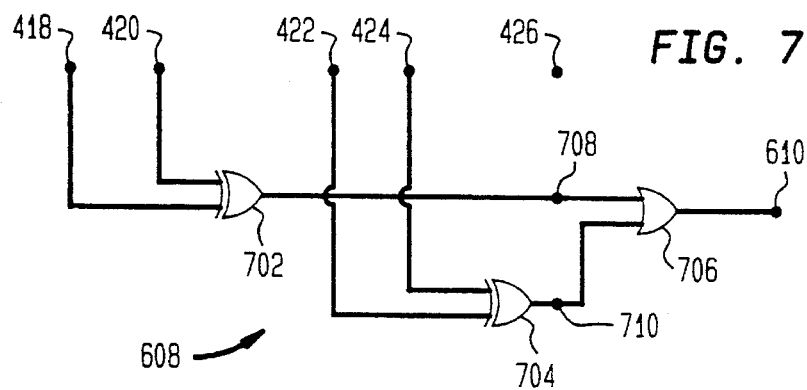
FIG. 7 is a block diagram of a mixing circuit which represents an element of the clock synthesizer of FIG. 6.

The mixing circuit 608 can be implemented using various combinational networks. The structure and operation of such combinational networks will be apparent to persons skilled in the relevant art. One combinational network which can be used to implement the mixing circuit 608 is shown in FIG. 7, and shall now be described. Recall that the signals produced by the delay elements 406A–406D during the four tap case are shown as 804, 806, 808, and 810 in FIG. 8.

The mixing circuit 608 includes exclusive-OR gates 702, 704 and an OR gate 706. These gates 702, 704, 706 are interconnected and receive the signals present at nodes 418, 420, 422, and 424 (note that the signal present at node 426 is not used by the mixing circuit 608), such that the mixing circuit 608 generates a clock signal having a frequency which is different from the frequency of the reference clock signal $F_{IN}$ and the modified reference clock signal $F_{IN}$'.

Specifically, the signals present at nodes 418 and 420 are applied to the exclusive-OR gate 702. The exclusive-OR gate 702 performs the well known "exclusive-OR" logical operation using these two signals to thereby produce a signal 814, which is present at a node 708, and which is applied to the OR gate 610.

In a similar manner, the exclusive-OR gate 704 produces a signal 816, which is present at a node 7 10, and which is applied to the OR gate 610.

The OR gate 706 performs the well known "OR" logical operation using these signals 814, 816 discussed above to thereby produce a signal 818, which is present at a node 610, and which represents the output signal $F_{OUT}$ during the four tap case. As apparent from FIG. 8, the frequency of $F_{OUT}$ is four times the frequency of $F_{IN}$'.

The mixing circuit 604 can be implemented using various combinational networks. The structure and operation of such combinational networks will be apparent to persons skilled in the relevant art. For example, the mixing circuit 604 could be implemented by using the combinational network shown in FIG. 4, except that nodes 436 and 440 are forced to a high logical state in a well known manner. In this manner, the frequency of $F_{OUT}$ with be three times the frequency of $F_{IN}$'.

The clock synthesizer 601 can synthesize all of the frequencies shown in Table 1. Additional frequencies can be synthesized by modifying the combinational logic of the mixing circuits 4 10, 604, 610 (i.e., by using larger numbers of taps, for example). Such modifications will be apparent to persons skilled in the relevant art. Note that, while the mixing circuits 410, 604, 610 are shown in FIG. 6 as receiving all of the signals produced by the DLL 603, the mixing circuits 410, 604, and 610 may process only some of these signals depending on the specific implementation.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A delay-locked-loop based clock synthesizer for generating, from a reference signal, a clock signal having a frequency different from a frequency of the reference signal, comprising:

a delay-locked-loop circuit, comprising
a controllable delay circuit comprising a plurality of controllable delay elements serially connected to one another, each of said delay elements delaying said reference signal by an adjustable quantum of time such that said delay elements generate a plurality of delayed signals offset in time from one another and from said reference signal,
a first multiplexer, coupled to two or more of said delay elements, for receiving the delayed signals generated by said two or more of said delay elements, and for routing one of said received delayed signals to an output of said first multiplexer,
a phase detector, connected to said output of said first multiplexer, for receiving said routed delayed signal and said reference signal, and for generating a control signal indicative of a difference between a phase of said routed delayed signal and a phase of said reference signal, and
feedback means, connected to said delay elements and said phase detector, for transferring said control signal from said phase detector to said delay elements, wherein each of said delay elements adjusts, in accordance with said control signal, said quantum of time by which they each delay said reference signal, such that said phase of said reference signal is synchronized with said phase of said routed delayed signal;
one or more mixing circuits, each of said mixing circuits connected to said controllable delay circuit and associated with one of said two or more delay elements, said mixing circuits comprising combinational networks for logically combining said delayed signals such that said mixing circuits generate logically combined signals; and
a second multiplexer, connected to said mixing circuits, for receiving said logically combined signals and for routing one of said logically combined signals to an output of said second multiplexer, wherein said routed logically combined signal represents said clock signal.

2. The delay-locked-loop based clock synthesizer of claim 1, wherein said first and second multiplexers receive and operate in accordance with a control signal which identifies one of said two or more delay elements such that said first multiplexer routes to said first multiplexer output the delayed signal generated by the delay element identified by the control signal, and said second multiplexer routes to said second multiplexer output the logically combined signal generated by the mixing circuit associated with the identified delay element.

3. The delay-locked-loop based clock synthesizer of claim 1 further comprising a divider for generating a modified reference signal from said reference signal, wherein a frequency of said modified reference signal is equal to a frequency of said reference signal divided by a predetermined value, said divider being connected to said controllable delay circuit such that said delay elements delay said modified reference signal to thereby generate said plurality of delayed signals.

4. The delay-locked-loop based clock synthesizer of claim 1, further comprising an inverter for inverting said reference signal, an output of said inverter being connected to said phase detector such that said phase detector generates a control signal indicative of a difference between a phase of said inverted reference signal and a phase of said routed delayed signal.

5. The delay-locked-loop based clock synthesizer of claim 1, wherein each of said delay elements delays said reference signal by a quantum of time given by:

$$1/(2*F*X)$$

where F is the frequency of said reference signal and X is the number of delay elements electrically connected to said phase detector via said first multiplexer.

6. A delay-locked-loop based clock synthesizer for generating, from a reference signal, a clock signal having a frequency different from a frequency of the reference signal, comprising:

a frequency divider for generating a modified reference signal from said reference signal, wherein a frequency of said modified reference signal is equal to a frequency of said reference signal divided by a dynamically adjustable value;
a delay-locked-loop circuit, comprising
a controllable delay circuit, coupled to said frequency divider, comprising a plurality of controllable delay elements serially connected to one another, each of said delay elements delaying said modified reference signal by an adjustable quantum of time such that said delay elements generate a plurality of delayed signals offset in time from one another and from said modified reference signal,
a first multiplexer, coupled to two or more of said delay elements, for receiving the delayed signals generated by said two or more of said delay elements, and for routing one of said received delayed signals to an output of said first multiplexer,
a phase detector, connected to said output of said first multiplexer, for receiving said routed delayed signal and said modified reference signal, and for generating a control signal indicative of a difference between a phase of said routed delayed signal and a phase of said modified reference signal, and
feedback means, connected to said delay elements and said phase detector, for transferring said control signal from said phase detector to said delay elements, wherein each of said delay elements adjusts, in accordance with said control signal, said quantum of time by which they each delay said modified reference signal, such that said phase of said modified reference signal is synchronized with said phase of said routed delayed signal;
one or more mixing circuits, each of said mixing circuits connected to said controllable delay circuit and associated with one of said two or more delay elements, said mixing circuits comprising combinational networks for logically combining said delayed signals such that said mixing circuits generate logically combined signals; and a second multiplexer, connected to said mixing circuits, for receiving said logically combined signals and for routing one of said logically combined signals to an output of said second multiplexer, wherein said routed logically combined signal represents said clock signal.

* * * * *